United States Patent [19]

Schröder

[11] Patent Number: 4,513,253

[45] Date of Patent: Apr. 23, 1985

[54] ELECTRONIC AMPLIFIER HAVING A TRANSMISSION FACTOR THAT IS VARIABLE BY MEANS OF A CONTROLLABLE VOLTAGE, SPECIFICALLY AN EXPANDER

[75] Inventor: Ernst F. Schröder, Hanover, Fed. Rep. of Germany

[73] Assignee: Licentia Patent-Verwaltungs-GmbH, Frankfurt am Main, Fed. Rep. of Germany

[21] Appl. No.: 450,631

[22] Filed: Dec. 17, 1982

[30] Foreign Application Priority Data

Dec. 21, 1981 [DE] Fed. Rep. of Germany ....... 3150536

[51] Int. Cl.³ .............................................. H03G 3/20
[52] U.S. Cl. ...................................... 330/278; 330/86; 333/14
[58] Field of Search ............... 330/278, 279, 285, 131, 330/86; 333/14

[56] References Cited

U.S. PATENT DOCUMENTS 3,988,694 10/1976 Yamazaki ........................... 330/278

Primary Examiner—James B. Mullins
Assistant Examiner—G. Wan
Attorney, Agent, or Firm—Spencer & Frank

[57] ABSTRACT

An electronic amplifier having a transmission factor which can be varied by means of a control voltage, specifically an expander. A switch is provided for selective operation of the amplifier with a fixed control voltage or with a variable control voltage, with this switch being coupled with circuitry for reducing, during operation of the amplifier with a fixed control voltage, the output voltage of the control circuit generating the variable control voltage.

9 Claims, 4 Drawing Figures

ELECTRONIC AMPLIFIER HAVING A TRANSMISSION FACTOR THAT IS VARIABLE BY MEANS OF A CONTROLLABLE VOLTAGE, SPECIFICALLY AN EXPANDER

BACKGROUND OF THE INVENTION

The present invention relates to an electronic amplifier circuit having a transmission factor which can be varied by means of a control voltage and in particular an expander. It is known to make such amplifiers so that they can be switched on and off. For this purpose, the amplifier may be operated with a variable control voltage in one operating position and with a fixed control voltage in another operating position.

SUMMARY OF THE INVENTION

It is the object of the present invention to realize the switching between the two operating positions in such a manner that destruction of sensitive components, for example, as a result of excess voltages, is avoided.

The above object is achieved according to the present invention by an electronic amplifier circuit, particularly an expander circuit, which comprises: an amplifier having a transmission factor which can be varied by means of a control voltage, with the amplifier having a signal input, a signal output and a control voltage input; a control circuit means, responsive to the signal in the transmission path of the amplifier, for generating a variable control voltage; a source of fixed control voltage; a switching circuit means for applying the variable control voltage to the control input of the amplifier when in a first condition and for applying the fixed control voltage to the control input of the amplifier when in a second condition; and means, responsive to the condition of the switching circuit means, for reducing the output voltage of the control circuit means when the switching circuit means is in the second condition.

According to one embodiment of the invention the means for reducing is a variable gain amplifier circuit (or variable attenuator circuit) connected in series with the input of the control circuit means whose gain is reduced (or attenuation increased) when the switching circuit means is in the second condition, i.e. when the main amplifier is operating with the fixed control voltage.

According to a further embodiment of the invention, the means for reducing is a circuit arrangement which causes the output voltage of the control circuit means to assume a fixed reduced value.

DETAILED DESCRIPTION OF THE PREFERRED EMBODIMENTS

Figure 1:
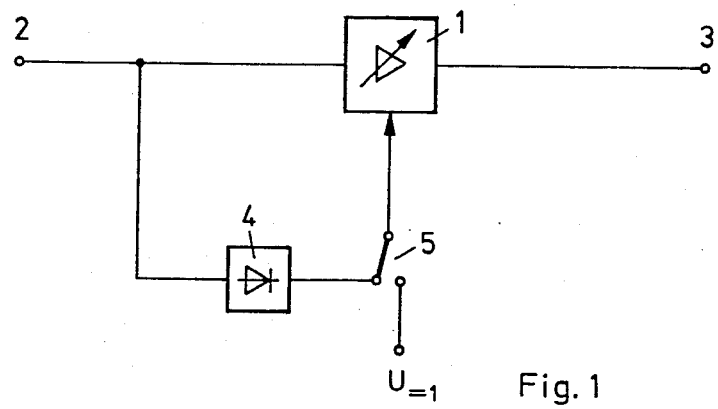
FIG. 1 is a basic represenation of a circuit with a mechanical switch and a fixed control voltage used to explain the invention.

In FIG. 1, the amplifier 1 receives a signal voltage at its input 2 and furnishes at its output 3 an amplified or changed, e.g. expanded, signal voltage. The degree of gain of the amplifier 1 is variable by means of the output signal from a control circuit 4. The control circuit 4 generates the control voltage for amplifier 1 in dependence on the signal voltages obtained at the input or at the output of the amplifier 1. In the amplifier circuit illustrated here, the signals for generating the control voltage are obtained from the input signals to the amplifier 1 because this results in a typical expander circuit (see Proceedings of the IEE, Vol. 111, No. 3, March 1964, pages 505 et seq.) The control voltage produced by control circuit 4 is fed to a control input of amplifier 1 via a switch 5 whose other switch position connects the control input of amplifier 1 with a fixed voltage source for the voltage $U_{=1}$. The range of variation of the control voltage produced by circuit 4 is assumed to range from 0.5 to 10 V. The fixed voltage $U_{=1}$ is assumed to be 5 V. Although this can be realized in the classical technique as shown, it is unsuitable for monolithically integrated circuits because in that case the characteristics of mechanical switches, i.e. very high blocking resistance and very small forward resistance, cannot be realized.

Figure 2:
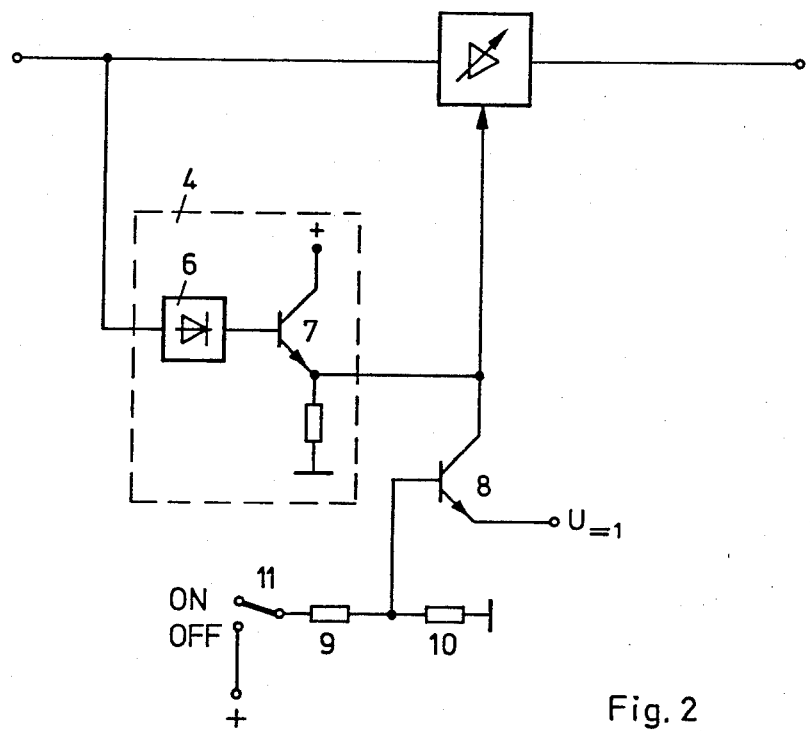
FIG. 2 shows a modification of the circuit shown in FIG. 1 with a transistor switch.

FIG. 2 shows an integratable modification of the circuit of FIG. 1 including a transistor 8 whose collector-emitter path forms the switching path of switch 5 from the control input of amplifier 1 to the fixed voltage $U_{=1}$ of FIG. 1. The base of transistor 8 is connected with a positive operating voltage via a base voltage divider 9, 10 and a switch 11. In the ON position of switch 11, as shown, the collector-emitter path of transistor 8 is blocked so that the amplifier is controlled by the output signal of control circuit 4. In the OFF position of switch 11, the collector-emitter path of transistor 8 has a low resistance and the control input of amplifier 1 lies essentially at voltage $U_{=1}$.

Control circuit 4 includes, in addition to the actual rectifier circuit 6, an output stage comprising a transistor 7 connected as an emitter follower, with the output electrode of transistor 7 likewise being connected with the control input of amplifier 1. In dependence on the input signal of amplifier 1, rectifier circuit 6 furnishes a control voltage between 0.5 and 10 V, independent of the position of switch 11. As long as this control voltage, with switch 11 in the OFF position and thus with the collector-emitter path of transistor 8 having a low resistance, is less than the voltage across transistor 8 plus the forward voltage of the base-emitter path of transistor 7, the base-emitter path of transistor 7 is polarized in the blocking direction. If, however, this control voltage increases further, the base-emitter path of transistor 7 is in danger. If the voltage $U_{=1}$ across transistor 8 is about 5 V, as in FIG. 1, the base-emitter path of transistor 7 would be endangered by all control voltages lying between 5.6 V and 10 V, i.e. 5.6 V divided by 5 V+ average forward voltage of a silicon diode.

Figure 3:
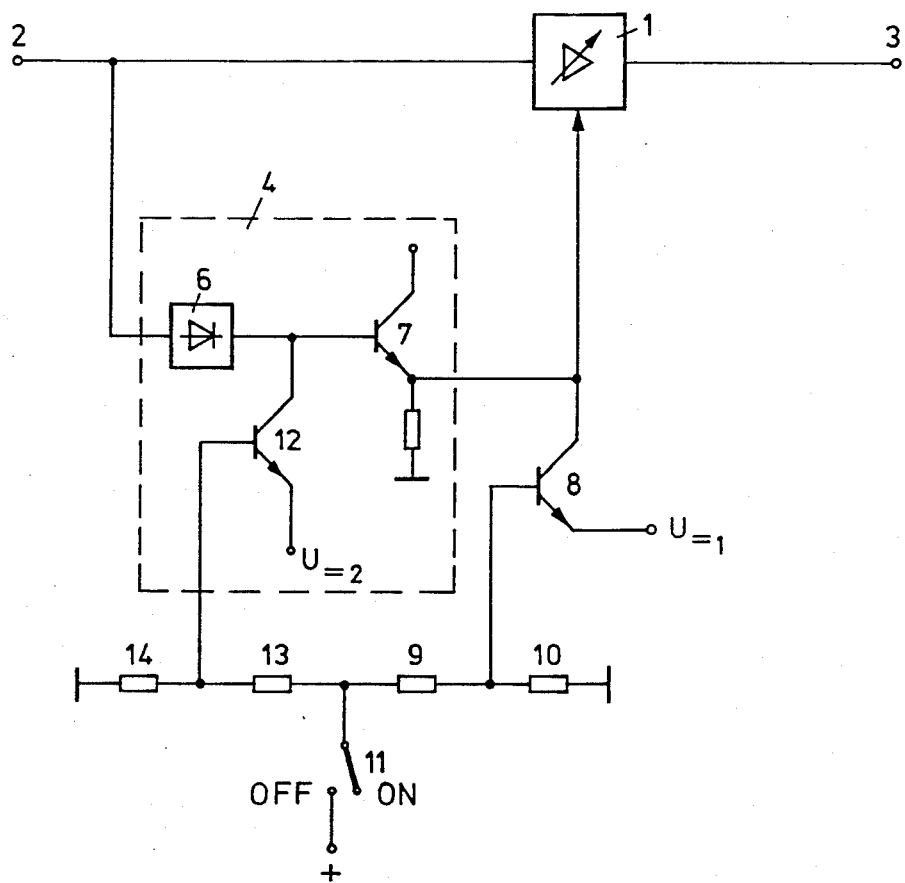
FIG. 3 is a circuit diagram of a modification of the circuit shown in FIG. 2 with coupled reduction of the control voltage according to the invention.

FIG. 3 shows an integratable circuit according to FIG. 2 in which the above-mentioned danger to transistor 7 caused by the switching is avoided. For this purpose, a transistor 12 is connected to rectifier 6 such that its collector-emitter path is connected between the output of rectifier 6 and a fixed direct voltage $U_{=2}$, and its base is connected with switch 11 via a base voltage divider 13, 14, so that transistor 8, which is connected with the fixed voltage source $U_{=1}$, and transistor 12, which is connected with the fixed voltage source $U_{=2}$, are switched simultaneously. With each switching of switch 11 to the positive operating voltage, i.e. the OFF position, the transistor 8 is thus switched to provide the fixed direct voltage $U_{=1}$ at its collector and the transistor 12 is switched to provide a control voltage corresponding to the fixed voltage $U_{=2}$ at the base of transistor 7. If voltage $U_{=2}$ is dimensioned to be less than voltage $U_{=1}$, the base-emitter path of transistor 7 will always be polarized in the blocking direction when transistors 8 and 12 are switched through and will not be in danger. In FIG. 3, switch 11 is simultaneously utilized as the switch for transistors 8 and 12. However, two separate, coupled switches could also be used.

Figure 4:
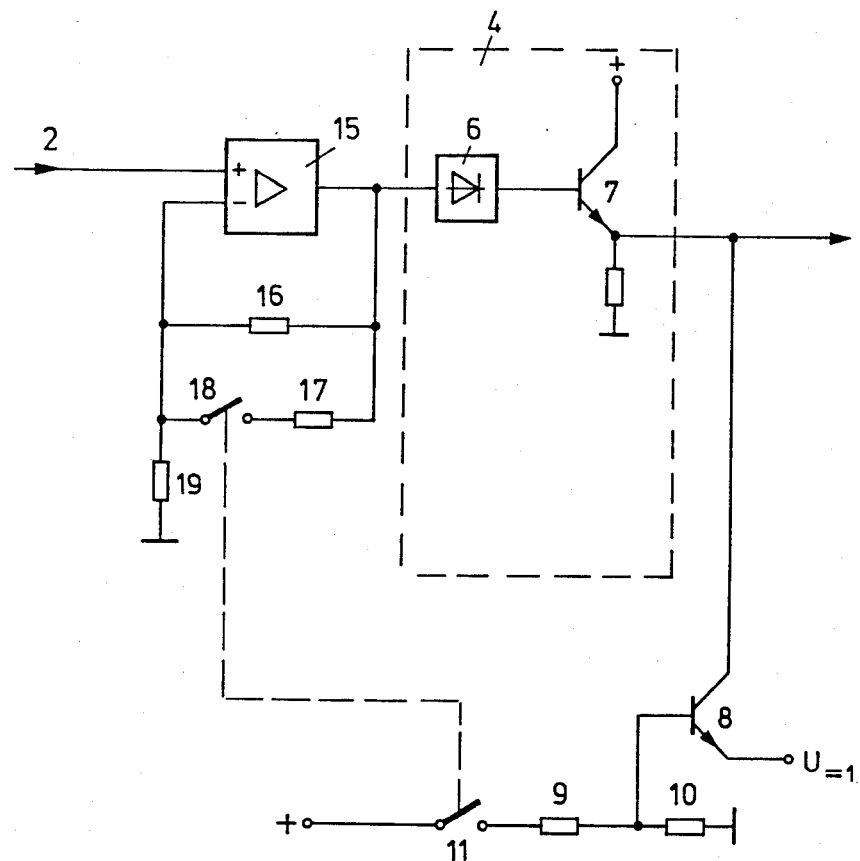
FIG. 4 is a circuit diagram with coupled reduction of the input voltage of the control circuit according to a further embodiment of the invention.

FIG. 4 shows another integratable modification of FIG. 2 with which the drawbacks of FIG. 2 can be avoided. As in FIG. 2, the input signals of amplifier 1 are fed to control circuit 4, but in this case via an operational amplifier 15 connected ahead of the actual rectifier circuit 6. The output electrode of this operational amplifier 15 is connected via a resistor 16 with its second input electrode (the negative input as shown) which is connected to ground via a resistor 19. The series connection of a resistor 17 and a switch 18 is connected in parallel with resistor 16. With switch 18 in the illustrated position so that only feedback resistor 16 is associated with the operational amplifier 15, rectifier 6 furnishes a control voltage as is desired for operation of amplifier 1 as an expander. If switch 18 is closed to connect resistor 17 in parallel with resistor 16, the totally effective resistance of the parallel resistors 16, 17 is known to be less than the smallest of these two resistors. Thus, the gain of the amplifier circuit 15, 16, 17, 19 is reduced and consequently the degree of attentuation is increased. The resistors 16 and 17 are advisably dimensioned in such a manner that the output voltage of the amplifier (or attenuating) circuit 15, 16, 17, 19 is reduced, for example, by the factor 10. The possible output voltage of rectifier circuit 6 is thus likewise reduced. This arrangement also avoids danger to transistor 7. Switches 11 and 18 are coupled (as shown) or may be combined. FIG. 4 shows a so-called noninverting amplifier circuit 15, 16, 17, 19. It is also possible to use here a so-called inverting amplifier circuit and to reduce its gain via a switch.

It will be understood that the above description of the present invention is susceptible to various modifications, changes and adaptions, and the same are intended to be comprehended within the meaning and range of equivalents of the appended claims.

What is claimed is:

1. An electronic amplifier circuit, particularly an expander circuit, comprising in combination: an amplifier having a transmission factor which can be varied by means of a control voltage, said amplifier having a signal input, a signal output and a control voltage input; control circuit means, responsive to the signal in the transmission path of said amplifier, for generating a variable control voltage; a source of fixed control voltage; switching circuit means for applying said variable control voltage to said control input of said amplifier when in a first condition and for applying said fixed control voltage to said control input of said amplifier when in a second condition; and means, responsive to the condition of said switching circuit means, for reducing the output voltage of said control circuit means when said switching circuit means is in said second condition.

2. The circuit defined in claim 1 wherein: said control circuit means includes an output stage transistor connected as an emitter follower whose output is connected to said control input of said amplifier; said switching circuit means includes a further transistor having its emitter-collector path connected between said control input of said amplifier and said source of fixed control voltage, and having its base connected to a switch, which when closed connects said base to a source of operating potential which renders said further transistor conductive to apply said fixed control voltage to said control input of said amplifier, and thus places said switching circuit means in said second condition; and said means for reducing is responsive to the position of said switch.

3. The circuit defined in claim 2 wherein the input of said control circuit means is connected to said signal input of said amplifier.

4. The circuit defined in claim 2 wherein said means for reducing includes a further amplifier circuit connected in series with the input of said control circuit means, and means for decreasing the gain of said further amplifier circuit when said switching circuit means is in said second condition.

5. The circuit as defined in claim 2 wherein said means for reducing includes an attenuation circuit connected in series with the input of said control circuit means, and means for increasing the degree of attenuation of said attenuator circuit when said switching circuit means is in said second condition.

6. The circuit defined in claim 4 wherein said further amplifier circuit includes an operational amplifier having first and second input terminals and an output terminal with said first input terminal being connected to receive an input signal, and with said second input terminal being connected with a point of reference potential via a first resistor and with said output terminal via a second resistor; and wherein said means for decreasing the gain includes the series connection of a third resistor and a further switch connected in parallel with said second resistor, and means for coupling said further switch to said switch circuit means so as to control the opening and closing of said further switch in response to said first and second conditions of said switching circuit means.

7. The circuit defined in claim 1 wherein: said switching circuit means includes a first transistor having its emitter-collector path connected between said control electrode and said source of fixed control voltage, and switch means for applying a fixed bias voltage to the base of said first transistor when in a first position to render said first transistor conductive and thus place said switching circuit means in said second condition; the output of said control circuit means is connected to said control input of said amplifier; and said means for reducing includes means, connected to the output of said control circuit means, for causing the output voltage of said control circuit means to be switched to a predetermined fixed direct voltage when said switch means is in said first position.

8. The circuit defined in claim 7 wherein said predetermined fixed direct voltage is less than said fixed control voltage.

9. The circuit defined in claim 7 wherein: said control circuit means includes an output stage transistor connected as an emitter-follower; and said means for causing includes a further transistor having its emitter-collector path connected between the base of said output stage transistor and a source of fixed direct voltage of a value less than the value of said source of fixed control voltage, and circuit means for applying a fixed bias volage to the base of said further transistor to render same conductive when said switch means is in said first position.

* * * * *